United States Patent [19]
Green et al.

[11] Patent Number: 5,348,488
[45] Date of Patent: Sep. 20, 1994

[54] ELECTRICAL CONNECTOR WITH BOARD-MOUNTING ALIGNMENT SYSTEM

[75] Inventors: Eric T. Green, Hummelstown; David T. Shaffer, Mechanicsburg; Charles F. Staley, Harrisburg, all of Pa.

[73] Assignee: The Whitaker Corporation, Wilmington, Del.

[21] Appl. No.: 46,046

[22] Filed: Apr. 9, 1993

[51] Int. Cl.⁵ .......................................... H01R 23/72
[52] U.S. Cl. ................................. 439/140; 439/892
[58] Field of Search .............. 439/140, 141, 149, 150, 439/70–73, 374, 892, 893

[56] References Cited

U.S. PATENT DOCUMENTS

| | | | |
|---|---|---|---|
| 3,512,116 | 5/1970 | Miwa et al. | 439/893 |
| 3,545,606 | 12/1970 | Bennett et al. | 206/56 |
| 4,655,516 | 4/1987 | Shaffer et al. | 439/67 |
| 4,992,054 | 2/1991 | Cassan | 439/892 |
| 5,055,069 | 10/1991 | Townsend et al. | 439/608 |
| 5,078,626 | 1/1992 | Matsuoka et al. | 439/892 |
| 5,104,326 | 4/1992 | Smith et al. | 439/95 |
| 5,133,679 | 7/1992 | Fusselman et al. | 439/608 |

*Primary Examiner*—Neil Abrams
*Attorney, Agent, or Firm*—Anton P. Ness

[57] ABSTRACT

An electrical connector assembly (10) of low profile for mounting onto a mother board (150), and having a housing (12) and an array of contacts (40) having elongate pin sections (42) insertable into through-holes (156) of mother board (150). The assembly includes a thin apertured organizer (50) movable along pin sections (40) and further includes a pair of guide posts (80) affixed to the housing (12) for example and extending through larger-diametered apertures (58) through organizer flanges (60) to leading ends (84) insertable into guide holes (154) of mother board (100). Organizer (50) abuts board (15) and is thereafter urged relatively toward and against housing (12) upon full mounting, being movable along guide posts (80) and pin sections (42). The assembly is accurately positionable with respect to the through-hole array by reason of the guide post leading ends (84) being received into guide holes (154) prior to pin section leading ends (44) entering through-holes (156).

10 Claims, 11 Drawing Sheets

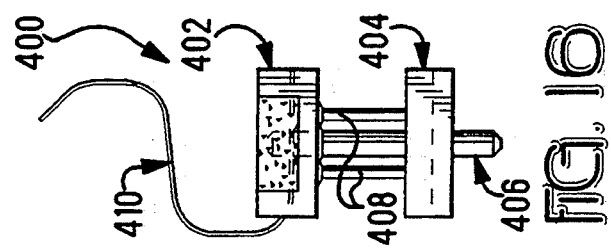
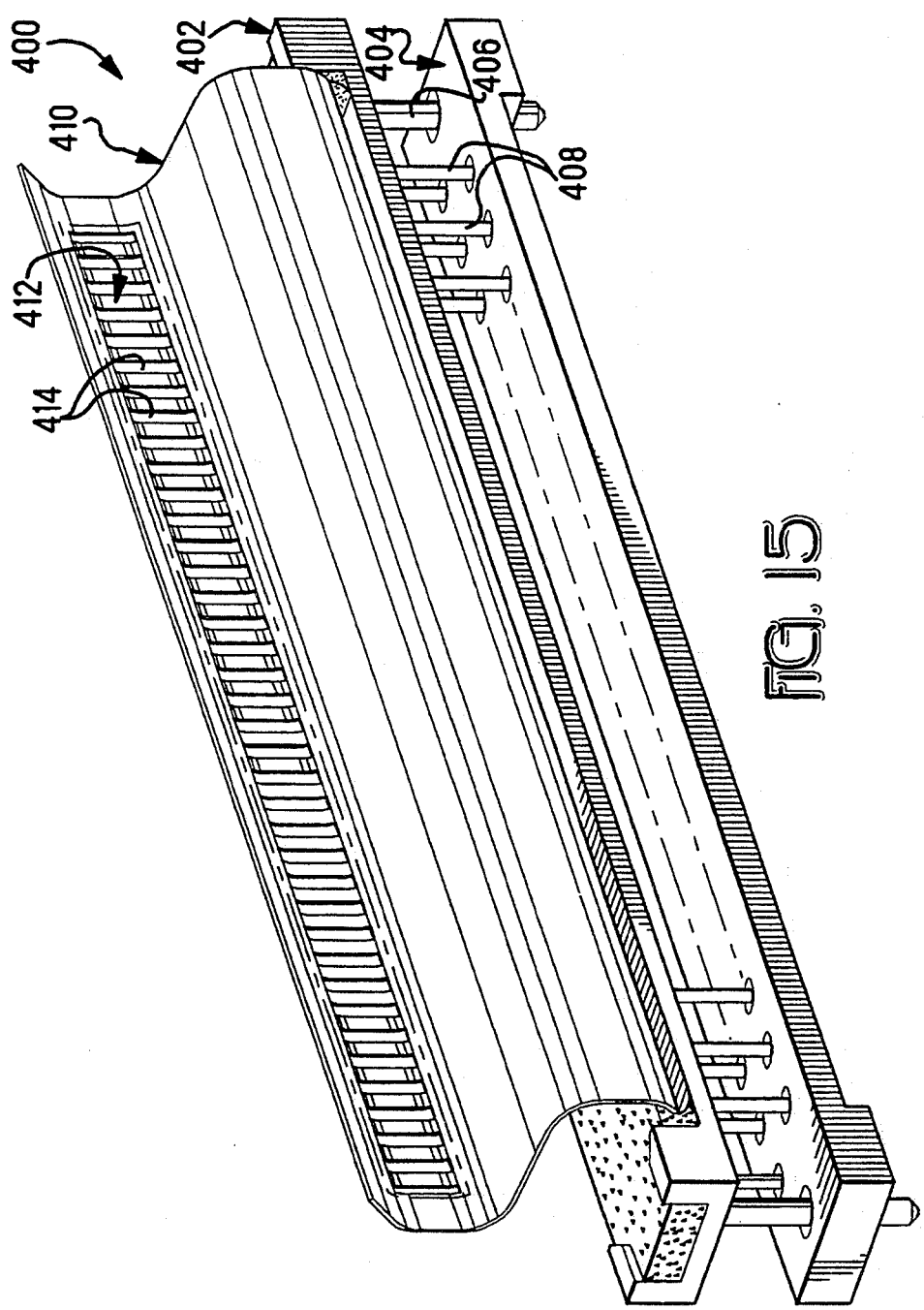

ELECTRICAL CONNECTOR WITH BOARD-MOUNTING ALIGNMENT SYSTEM

FIELD OF THE INVENTION

The present invention is related to electrical connectors and more particularly to connectors adapted to be mounted to a circuit board.

BACKGROUND OF THE INVENTION

Certain electrical connectors contain an array of electrical contacts having pin sections coextending from a mounting face of the connector to be received into respective through-holes of a circuit element such as a mother board to become electrically connected with circuits of the board. The dielectric housing of the connector includes passageways in which the contacts are respectively retained in selected spacings and positions so that the pin sections extend in a selected pattern. The through-holes of the mother board are drilled in a selected array or pattern to which the contact pattern of the connector is chosen to match, for the pin sections to be all aligned with respective through-holes to be received thereinto upon mounting the connector to the mounting surface of the mother board.

The pin sections of the contacts are elongate, and increasingly the industry is miniaturizing the diameters thereof and reduced centerline spacing in an overall economy of mother board real estate. There is a susceptibility during connector handling prior to board mounting, for damage to the pin sections or at least undesirable deflection of one or more of the pin sections from a precisely orthogonal orientation relative to the mounting face. Certain connectors are known in which a thin dielectric plate or film member or organizer is initially disposed over the leading ends of the pin sections to retain the leading ends fixed in position and thus prevent incidental misalignment of the pin sections during handling. Upon mounting, the leading ends of the contacts easily and simultaneously enter corresponding ones of the through-holes; and upon engagement of the organizer with the mounting surface of the mother board, the organizer is urged upwardly along the pin sections towards and to the mounting face of the connector housing whereafter it remains innocuous during in-service use. Use of organizers is generally disclosed in U.S. Pat. Nos. 4,655,516 and 3,512,116.

It is known for circuit boards to provide mounting holes adjacent and outwardly of an array of through-holes to enable fastening hardware such as board locks affixed to a connector to be inserted to secure the connector in position upon full insertion of the pin sections into and through the respective through-holes, and flanges of the connector housing include apertures correspondingly opposed to the mounting holes of the circuit board, outwardly from which shank sections of the fasteners extend properly positioned to be received into the mounting holes of the circuit board.

It is desired to provide a board-mountable connector having very small diameter contacts and an organizer therefor, to have a means to assure accurate positioning of the connector with respect to the board prior to entry of the pin section leading ends into the respective through-holes of the circuit board.

SUMMARY OF THE INVENTION

The present invention provides a dielectric alignment plate or organizer for a board-mountable electrical connector which facilitates alignment of the pattern of pin sections of the contacts with the array of through-holes of a circuit element such as a mother board. Guide posts include first sections extending through and beyond a board-proximate surface of the plate at locations corresponding to guide holes of the mother board adjacent and generally spaced outwardly from the array of through-holes at precisely selected positions; and the guide posts include second sections extend from the plate at least into flanges at ends of the connector housing such as by being insert molded therein or force-fitted into apertures thereof. During board mounting, the first guide post sections extending beyond the alignment plate are inserted into corresponding guide holes of the mother board, thus aligning the plate and therefore the holes through which extend the pin sections of the contacts in appropriate positions to enter the respective through-holes which are referenced to the guide holes of the mother board; and the second guide post sections properly position the connector housing by extending into the flanges. After the leading ends of the pin sections enter and pass through the through-holes and the plate abuts the mother board mounting surface, the connector continues to be urged toward the board and the plate, as the pin sections are moved through the plate holes and the board holes, with the second guide post sections passing further through the apertures of the connector housing flanges thus maintaining all coaligned the plate and its hole array, the connector housing and the contact array, and the mother board and the through-hole array.

In one embodiment, the guide posts are permanently affixed to the dielectric plate with the first sections extending beyond the leading ends of the pin sections when the plate is positioned in its initial position spaced from the mounting face of the connector housing, and with the second sections extending through the flange apertures which have incrementally larger diameters than the constant post diameters of the second sections. During mounting, the second sections continue relatively passing through the apertures. The guide posts may be separate members insert-molded as part of the alignment plate, or may be force-fit through the post-receiving holes of the plate, or could be molded as integral portions of the housing.

In another embodiment, the guide posts are permanently affixed to the connector housing with the second sections for example insert molded within the flanges or press fit within apertures through the flanges, and with the first sections extending through incrementally-larger-diametered post-receiving holes of the alignment plate and having a constant post diameter. The plate is moved relatively along the first sections toward the housing mounting face during board mounting. The guide posts may be integrally molded as part of the housing, or may be force-fit through the flange apertures thereof.

It is an objective of the present invention to provide a board-mountable connector which includes integral means to assure alignment of its pin contact sections with through-holes of a circuit element such as a mother board prior to entry of the leading ends of the pin sections into the through-holes.

BRIEF DESCRIPTION OF THE DRAWINGS

FIGS. 15 and 16 are isometric and end views of an alternate embodiment of the present invention having fewer contacts and only one side portion of a flexible circuit element for interconnection to a daughter card.

DETAILED DESCRIPTION OF THE PREFERRED EMBODIMENTS

Figure 1:
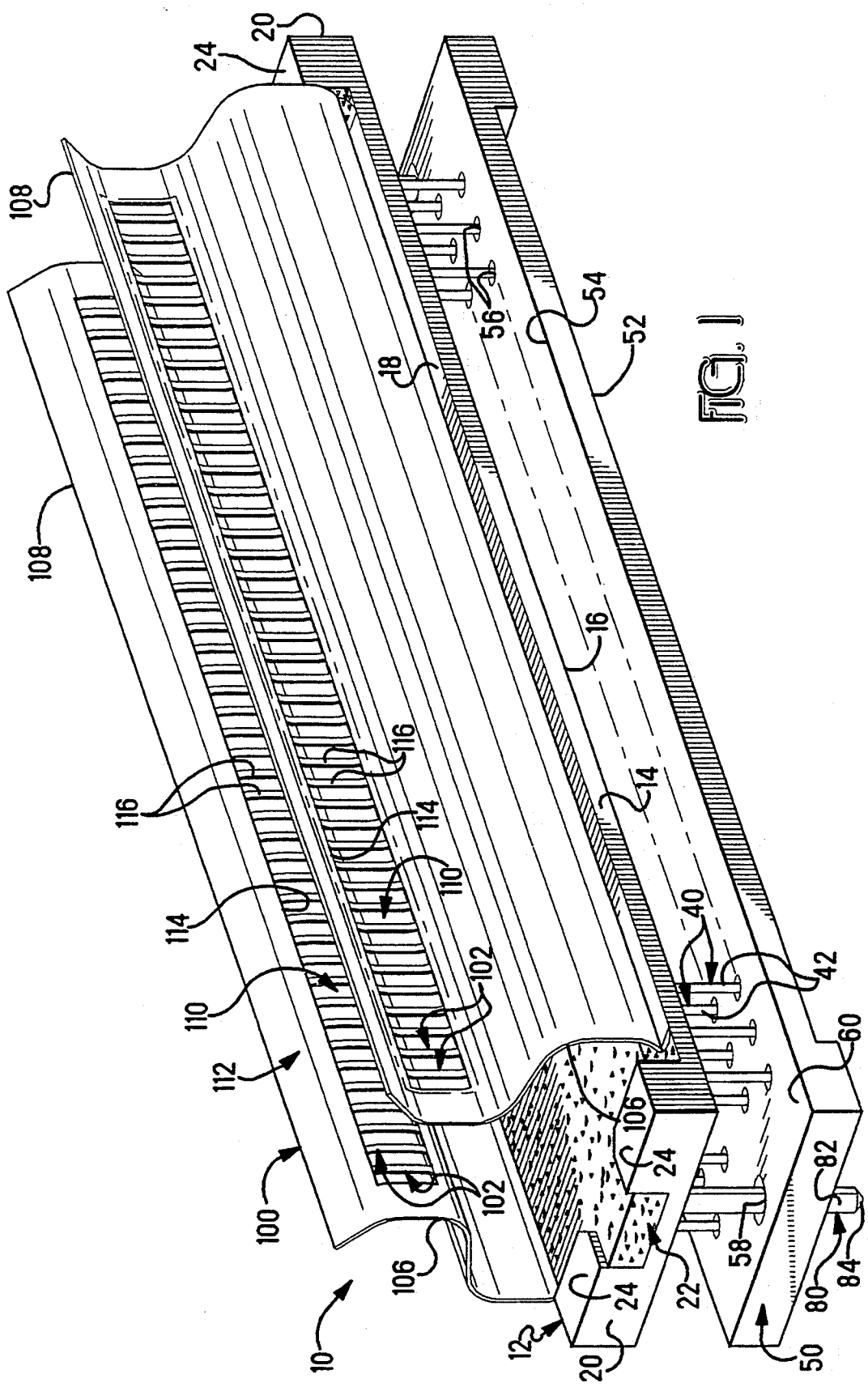
FIGS. 1 and 2 are an isometric and an elevation view of the conductor assembly of the present invention, with FIG. 2 illustrating a daughter card for being terminated to the connector assembly at an edge thereof.
Figure 2:
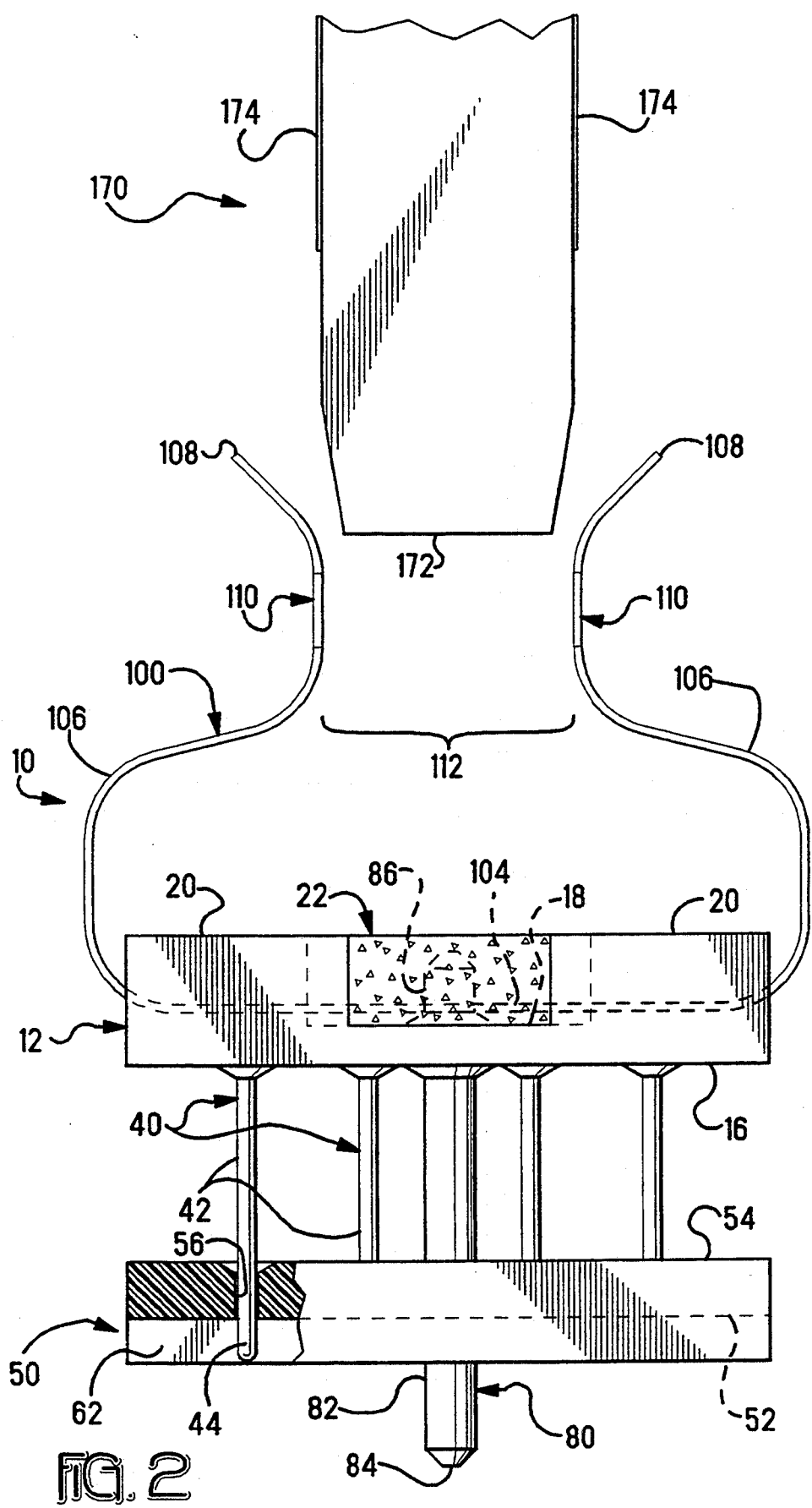

Electrical connector 10 in FIGS. 1 and 2 includes a housing 12 of dielectric material having a transverse body section 14 generally planar in shape and defining a board-proximate or mounting face 16 and an opposed board-remote or second face 18, and includes a plurality of electrical contacts 40 each including an elongate pin contact section 42 concluding in a leading end 44. Pin sections 42 coextend orthogonally from mounting face 16 are associated with respective ones of through-holes of a mother board, seen in FIGS. 3 to 5. Connector 10 is shown to include an organizer or alignment plate 50 of dielectric material having a board-proximate surface 52 and a housing-proximate surface 54, and having a plurality of larger-diametered pin-receiving holes 56 through which extend pin sections 42.

Guide posts 80 are located at each end of connector 10 and orthogonal thereto and include first sections 82 extending through and beyond alignment plate 50 and pin section leading ends 44 to leading ends 84. Second sections 86 are shown secured to housing 12 at flanges 20 such as by insert molding, while first sections 82 pass through larger-diametered post-receiving apertures 58 of end flanges 60 of alignment plate 50 in a manner permitting alignment plate 50 to be movable along first sections 82 of guide posts 80.

Figure 12:
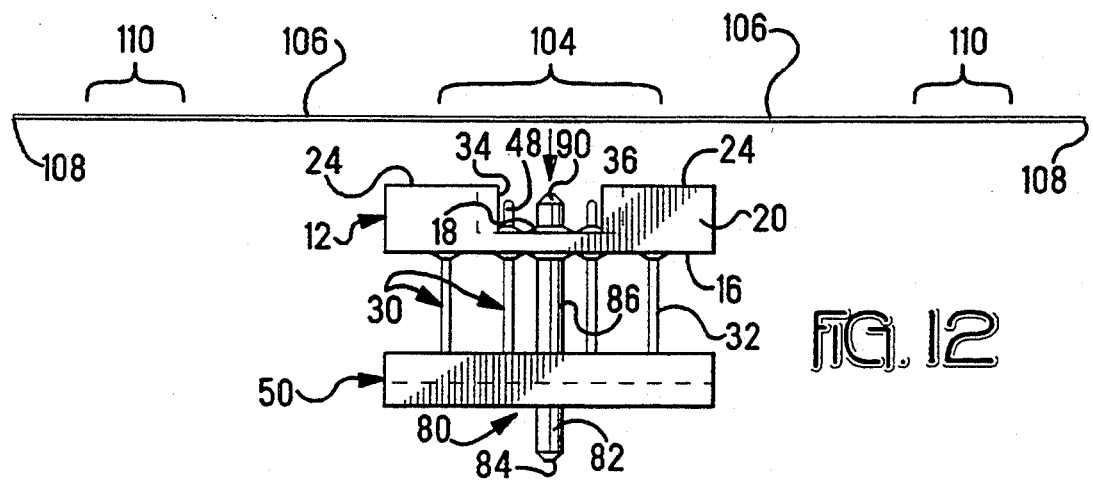
FIGS. 12 to 14 are end elevation views showing the flexible circuit element being affixed to the connector by soldering and then potting, and forming of the side portions of the flexible circuit element to define a daughter-card receiving region, for interconnection of circuits of the flexible circuit element to circuits of a daughter card.
Figure 13:
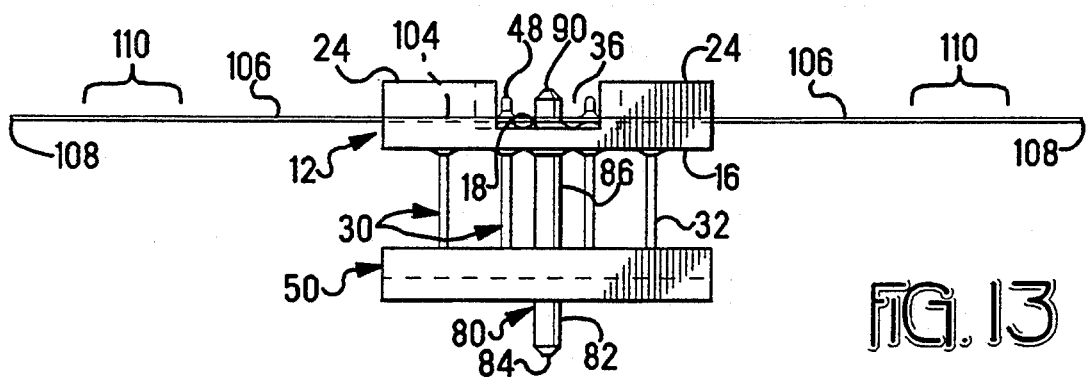
Figure 14:
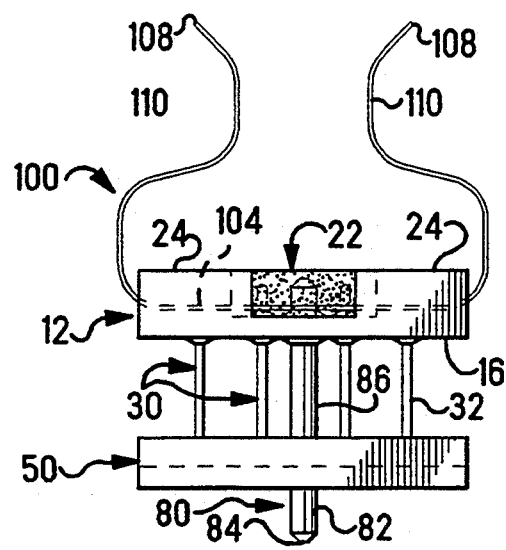

A flexible etched circuitry element 100 (best seen in FIG. 9) is affixed to second face 18 of connector housing 12, having circuit traces 102 defined along a housing-remote surface electrically connected at first interconnection region 104 such as by trace termini being soldered to exposed sections of contacts 40 of connector 10 along second face 18 of housing 12, such as is shown in FIGS. 12 to 14. Potting material 22 is then disposed atop first interconnection region 104 above second face 18 of housing 12 after soldering of traces 102 to contacts 40, insulating and sealing the electrical connections, enhancing structural rigidity of the connector and serving to retain flexible circuit element 100 affixed to housing 12 and provide strain relief to the electrical connections defined by the solder joints.

Use of such a flexible circuit element in general enables ease of interconnecting the contacts of the housing in certain centerline spacings of multiple rows, which corresponds to the through-hole array of the mother board, to traces of the daughter card disposed in two planes and at different centerline spacings; additionally a multi-layer flexible circuit can if desired be used to easily reroute the contacts to different selected traces of a daughter card. The connector also provides a means for easily compensating for and accommodating daughter cards of varying thicknesses, such as between about 0.155 inches and 0.185 inches. Being flexible, and being affixed to the particular design of connector 10 which permits flexing, the flexible circuit element permits incremental movement of the connector along an axis orthogonal to the thickness of the daughter card, which permits the daughter card to be constrained by guide means of the structure in which the assembly is mounted (not shown) which only generally aligns the daughter card and connector with the through-hole array, while connector 10 can be incrementally moved to become precisely opposed from the through-hole array of the mother board for board mounting.

Flexible circuit element 100 is shown having a pair of vertically extending side sections 106 so formed as to extend from housing 12 and away from second face 18 to free edges 108. Side sections 106 include opposed second interconnection regions 110 adjacent free edges 108 defining a card-receiving region 112 whereat a portion of the dielectric film 114 has been removed exposing lengths 116 of circuit traces 102 for electrical connection to another electrical device such as daughter card 170, by being soldered to respective circuit traces 174 of the daughter card along opposing surfaces positioned near leading end 172 and adjacent to second interconnection regions 110. Preferably, to facilitate formability of flexible circuit element 100, a layer of copper 118 has been deposited along a housing-proximate surface of the circuit element (and then coated with an outer dielectric layer) with edges of the metal layer terminating a distance away from second interconnection regions 110 and from the pin-receiving apertures through the trace termini of circuit traces 102 of first interconnection region 104.

Figure 3:
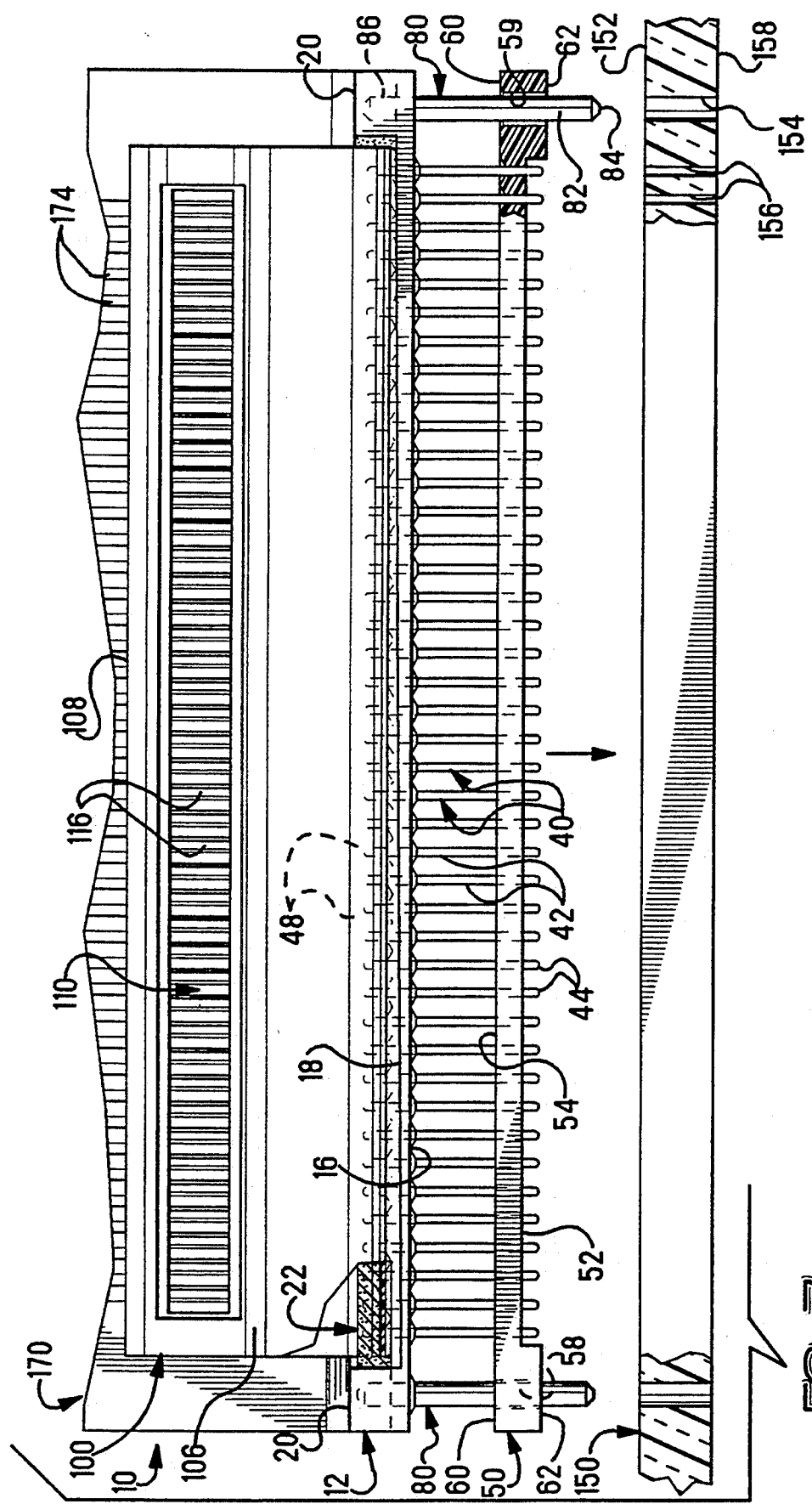
FIGS. 3 to 5 are elevation views of the electrical connector of FIGS. 1 and 2 being mounted onto a mother board with pin sections of contacts thereof entering and extending through through-holes of the board.
Figure 4:
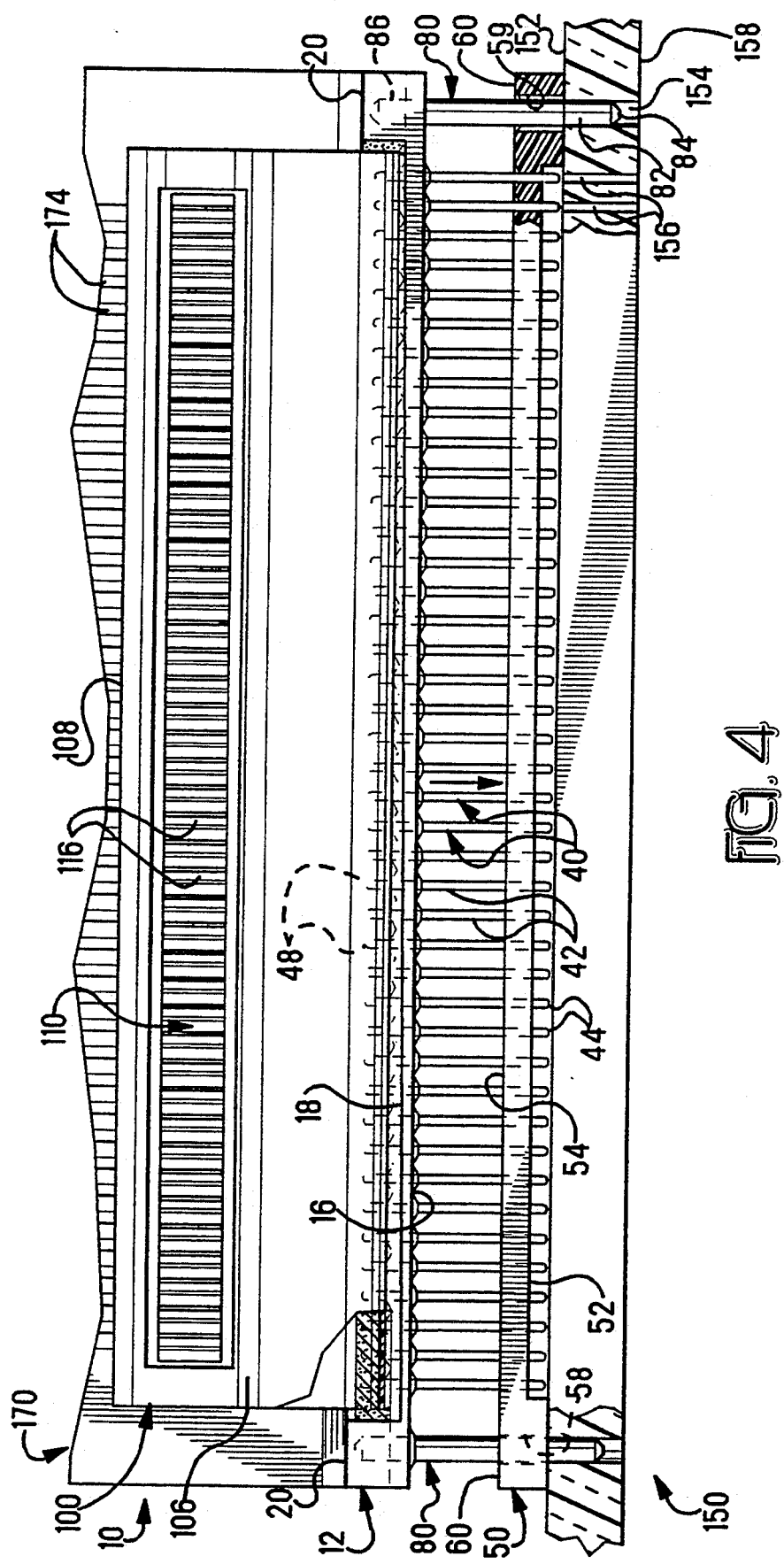
Figure 5:
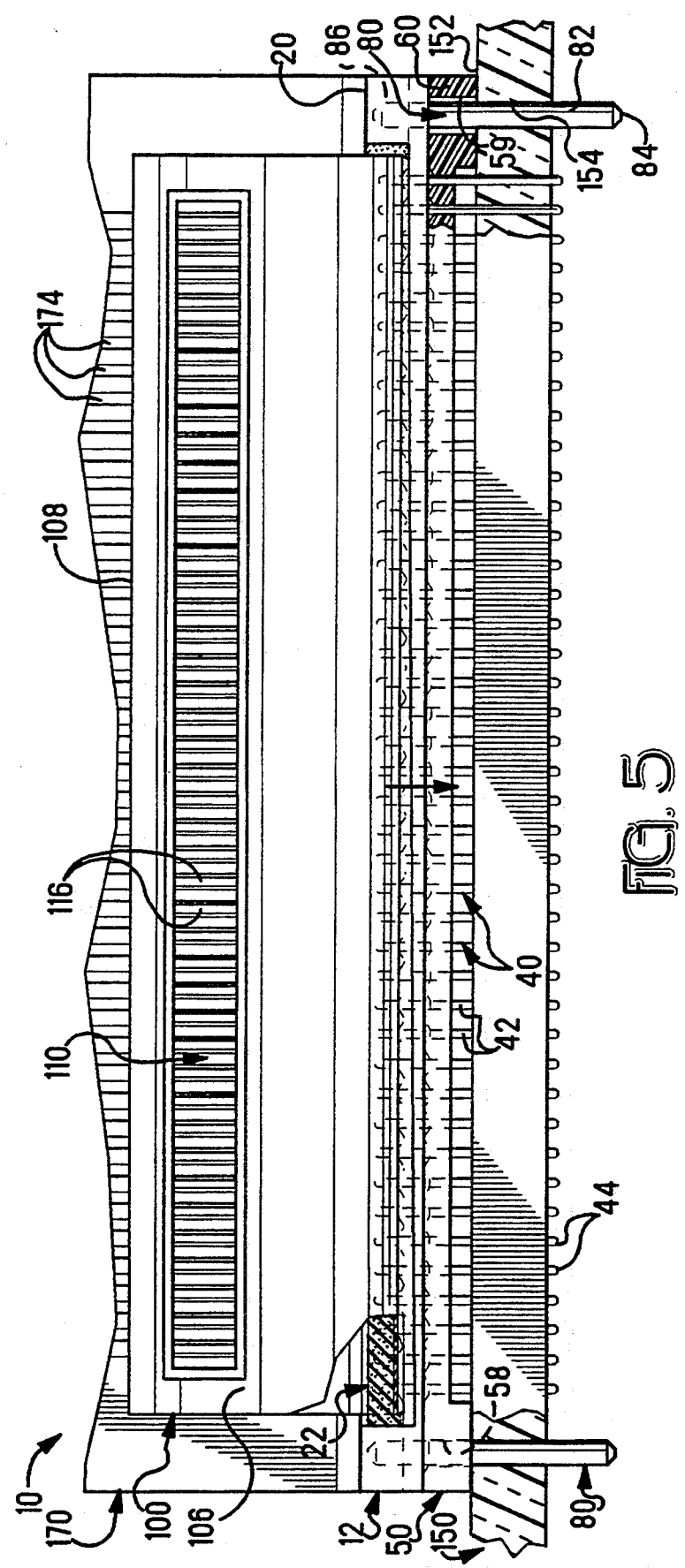

Referring now to FIGS. 3 to 5, connector 10 is positioned above mounting surface 152 of mother board 150, with guide posts 80 aligned with guide holes 154 of mother board 150, which inherently aligns pin sections 44 with respective through-holes 156. End flanges 60 of alignment plate 50 include embossments 62 extending from board-proximate surface 52 a selected small distance which engage mounting surface 152 of mother board 150 to position board-proximate surface 52 a small distance spaced from mother board 150, thus permitting cleaning of flux adjacent pin sections 42 following soldering to the circuits of mother board 150 and also permitting air flow for heat dissipation during in-service use. Alignment plate 50 is movable along parallel pin sections 42 toward board-proximate face 16 of housing 12, after abutting mounting surface 152 of mother board 150 during initial stages of connector mounting. Alignment plate 50 is abuttable with mounting face 16 of connector housing 12 upon completion of connector mounting, and remains positioned there during in-service use without affecting electrical performance of the connector. Upon insertion of pin sections 42 through-holes 156, pin sections 42 will advantageously be soldered along remote surface 158 to define electrical connection with traces of the mother board.

Guide post aperture 58 is circular and is used as the primary datum for pin section alignment during assembly, while guide post aperture 59 is preferably oblong along an axis intersecting aperture 58, permitting forgiveness of alignment plate and housing molding tolerances in the direction along the axis while maintaining precision alignment transversely of that axis and serving as a secondary datum.

As shown in FIGS. 3 to 5, connector 10 has been assembled to an edge portion 172 of a daughter card 170. Leading end 172 of card 170 has been inserted into card-receiving region 112 between opposed second interconnection regions 110, and traces 174 soldered to lengths 116 of traces 102 of flexible circuit element 100, thus interconnecting daughter card 170 to mother board 150. Optionally, sealing or potting material can then be applied over the solder joints of circuit trace portions 116 to the daughter card traces 174 which would then completely insulate the daughter card and flexible circuit traces from inadvertent contact with other conductive portions of closely spaced adjacent daughter card/connector structures, to assure signal integrity. Connector 10 is especially suited for use in contained environments of limited space, whereby mother board 150 and one or more daughter cards 170 interconnected thereto by similar connectors in a closely spaced arrangement of minimal overall size, are secured in position by wall structure or framework or fasteners (not shown) in an enclosed system where the interconnected assembly is exposed to minimal strain and stress.

Connector 10 can be miniature to occupy very little mother board real estate, and define a low profile. For example, each contact can possess a diameter of 0.011 inches at pin-to-pin centerline spacing of 0.075 inches. The holes of alignment plate 50 can have a diameter of about 0.012 inches with tight enough tolerance to assure 0.0005 inches diameter greater than the diameter of pin sections 42. Preferably both housing 12 and alignment plate 50 can be molded of VECTRA glass-filled LCP polyester thermoplastic resin sold by Hoechst-Celanese Corp. of Chatham, N.J. Four rows of contacts are receivable into respective through-holes of the mother board in an array measuring 1.537 inches by 0.25 inches, with each hole having a inner diameter of 0.012 inches. Guide posts 80 can be of stainless steel and have a diameter of for example 0.031 inches with guide holes 62 of organizer 50 having diameters of 0.032 inches, with guide hole being oblong with a longer dimension of about 0.040 inches. Guide holes 154 of mother board 150 similarly having diameters of 0.032 inches and have centerlines spaced precisely 0.082 inches from ends of the array of through-holes 156 and defining reference data, corresponding to guide posts 80 being spaced from the array of contacts 40 precisely 0.082 inches from the ends thereof, and guide holes 58,59 of alignment plate 50 also have centerlines spaced 0.082 inches from ends of the array of pin-receiving apertures 56, maintaining and complementing the precise referenced relationship of pin sections of the contacts with the through-holes once established by leading ends 84 of the guide posts in guide holes 154 of mother board 150.

The connector may be fabricated to have a thickness of body section 14 of 0.028 inches with the thickness of alignment plate 50 being 0.038 inches. Connector housing 12 is shown to have embossments 24 at the corners of body section 14 extending from flanges 20 having a height of 0.052 inches beyond second face 18 of housing 12, while low-height embossments 62 at end flanges 60 of alignment plate 50 extend beneath board-proximate surface 52 thereof a distance of 0.024 inches. Altogether the height of the assembly above the mother board mounting surface 152 is thus 0.142 inches, and defines a considerably low profile of solid structure when fully mounted onto mother board 150, permitting daughter card leading edges to abut the potting material 22 and be only 0.142 inches from the mother board.

Figure 6:
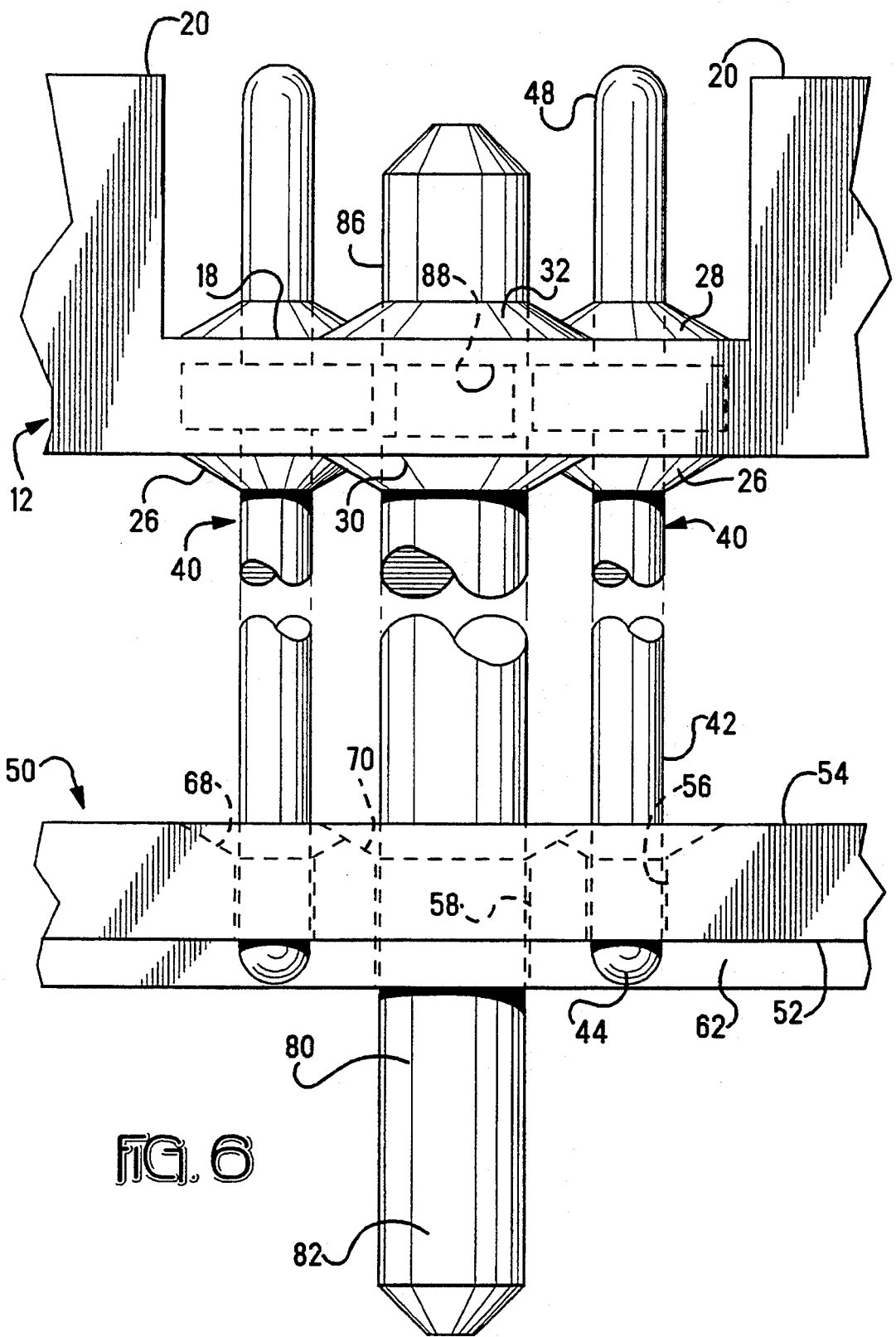
FIG. 6 is an enlarged partial elevation view showing the relationship of the connector housing, organizer, contacts and guide posts.

Referring to FIG. 6, it is preferred to define frustoconical embossments 26 surrounding each contact section extending from board-proximate or mounting face 16 of connector housing 12, and frustoconical embossments 28 surrounding each contact section 48 extending upwardly from the board-remote or second face 18, enhancing the ability of housing 12 to strengthen and stabilize the retention of contacts 40 within body section 14. Further it is preferred to provide annular flanges 45 along contacts 40 embedded within body section 14 during the insert molded process, which facilitate the gripping of body section 14 to each contact 40. Such fructoconical embossments 26,28 greatly increase the axial length of the contacts 40 embedded within material providing greater surface area for adhesion, more assured mechanical support along both sides of annular flanges 45 enhancing the sturdiness of the housing about each contact 40, and increased length of the mechanical support laterally along the contacts 40 for maintaining alignment of the contacts which have elongate pin sections 42 extending from housing 12 which are thus susceptible to deflection out of alignment. Similarly, embossments 30,32 extend from surfaces 16,18 along second sections 86 of guide pins 80 with similar benefits, with second sections 86 preferably having annular grooves 88 to enhance retention within housing 12 useful in the insert molding process.

Further assisting achievement of the benefits of structural strength and precise axial pin alignment, is potting material 22 embedding end portions of contact ends 48 extending above flexible circuit element 100, with axial alignment enhanced as the potting material is applied and cures when alignment plate 50 is positioned adjacent leading ends 44 of contacts 40.

Since the housing-proximate surface 54 of alignment plate 50 will abut mounting face 16 of housing 12 upon full mounting to mother board 150, it is desirable to define complementary frustoconical recesses 68 into housing-proximate surface 54 about each pin-receiving aperture 56 to receive frustoconical embossments 26 thereinto, and complementary frustoconical recesses 70 to receive frustoconical embossments 30, for flush abutment of board-remote face 54 of alignment plate 50 with mounting face 16 of housing 12.

Figure 7:
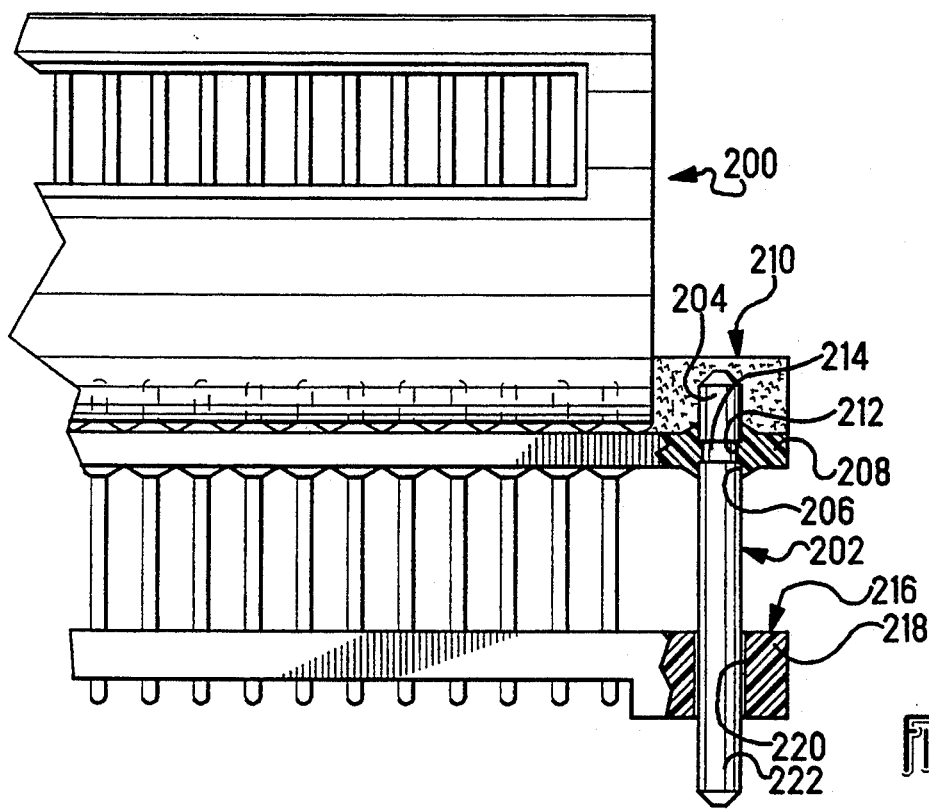
FIGS. 7 and 8 are enlarged elevation views partially in section showing one end of the connector of FIGS. 1 to 6 wherein the guide post is affixed to the connector housing and movable with respect to the organizer, and another embodiment wherein the guide post is affixed to the organizer and movable with respect to the housing.

In FIG. 7, each end of connector 200 includes a discrete guide post 202, in which a second section 204 have been force-fit into an aperture 206 of flange 208 of housing 210, or has been bonded therein, or both. Aperture 206 is shown having an annular ledge 212 centrally therealong which seats within annular groove 214 upon insertion of second section 204 into aperture 206. Each end of alignment plate 216 includes a flange 218 having an aperture 220 therethrough having a larger diameter than the diameter of first section 222 of guide post 202, permitting alignment plate 216 to be urged relatively toward connector housing 210. Each guide post 202 may be made for example of stainless steel. The embodiments of FIGS. 1 to 7 may be used when no particular necessity exists for a reduced length of guide post extending beneath the mother board upon full mounting of the connector thereto.

Figure 8:
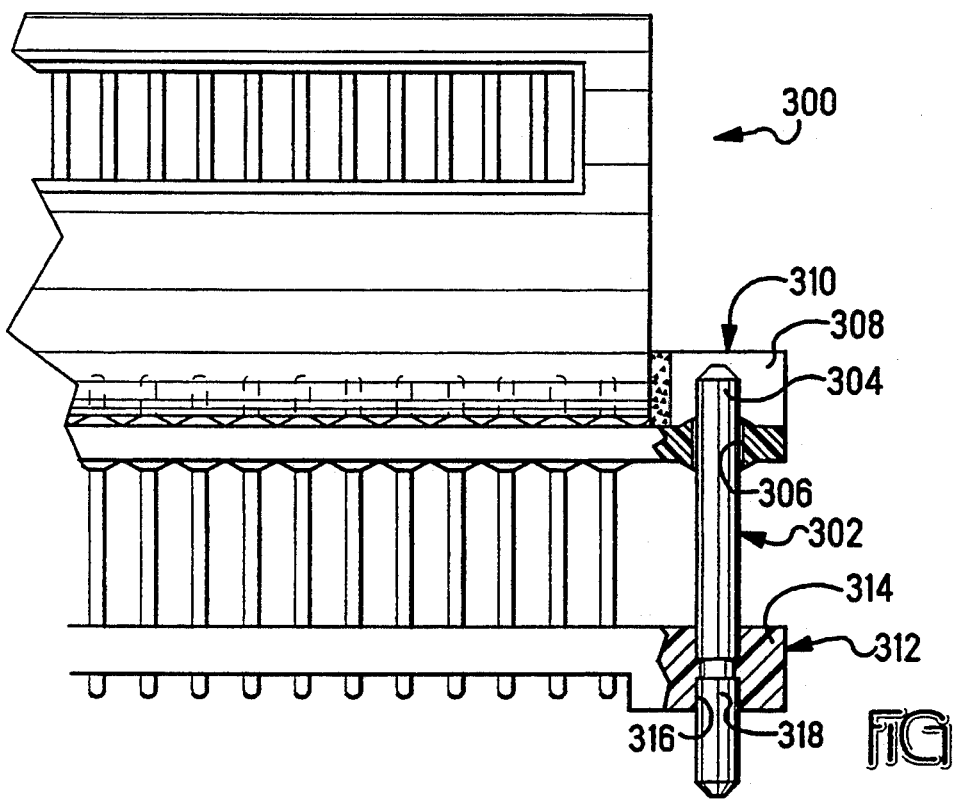

In the embodiment of connector 300 shown in FIG. 8, guide post 302 is shown to be a discrete member affixed to alignment plate 312 with first section 318 secured within aperture 316 in flange 314. Second section 304 extends through aperture 306 of flange 308 of housing 310, with aperture 306 having a slightly larger diameter than the diameter of second section 304 of guide post 302. As connector 300 is mounted onto a mother board and alignment plate 314 is moved toward housing 310, second section 304 passes through aperture 306 and rearwardly of flange 308. It is easily seen that a guide post may be integrally molded with alignment plate 314 instead of comprising a discrete member, similarly to connector 10 of FIGS. 1 to 6.

Figure 9:
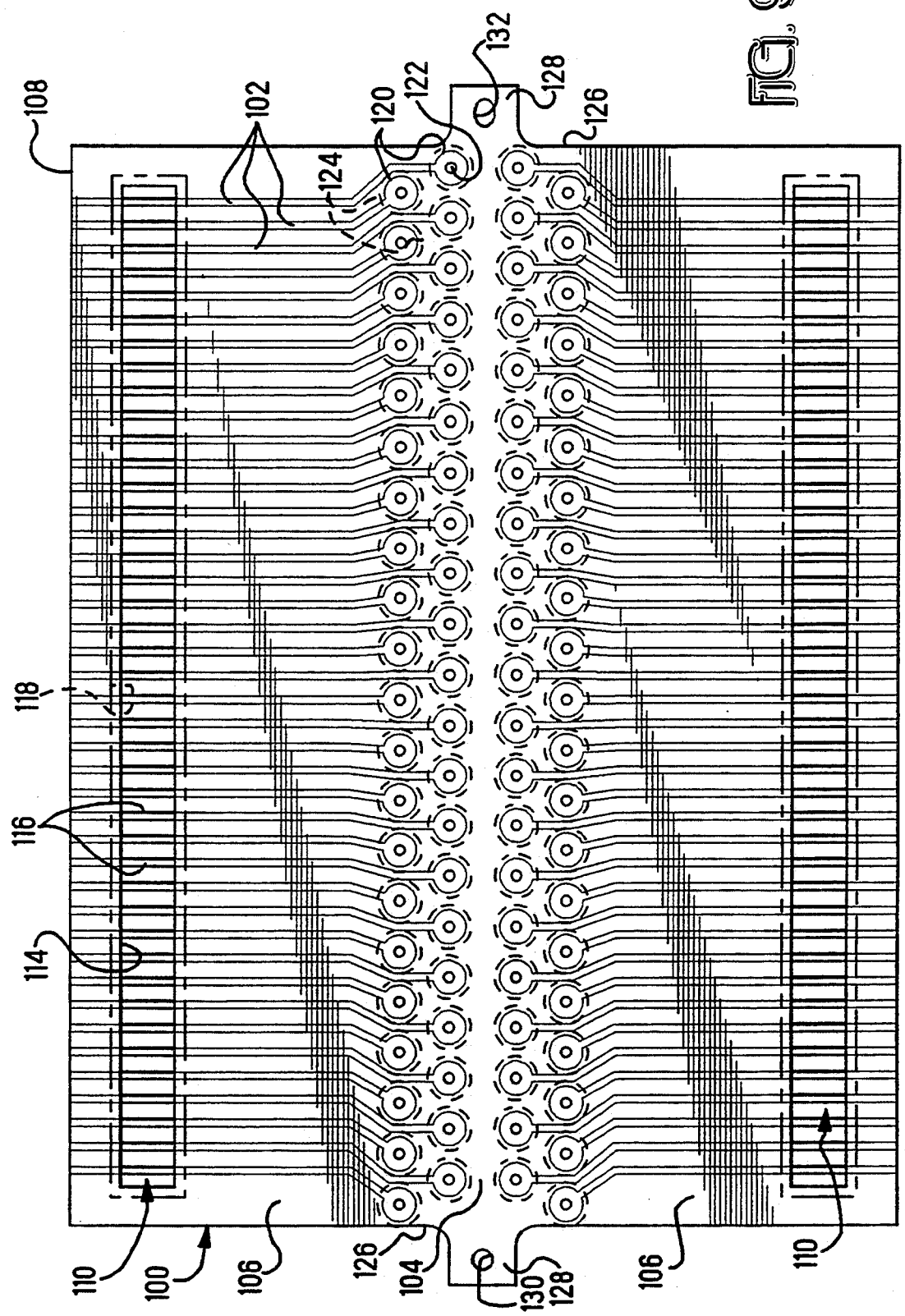
FIG. 9 is a plan view of the flexible etched circuit element to be assembled to the connector of FIGS. 1 to 8.
Figure 11:
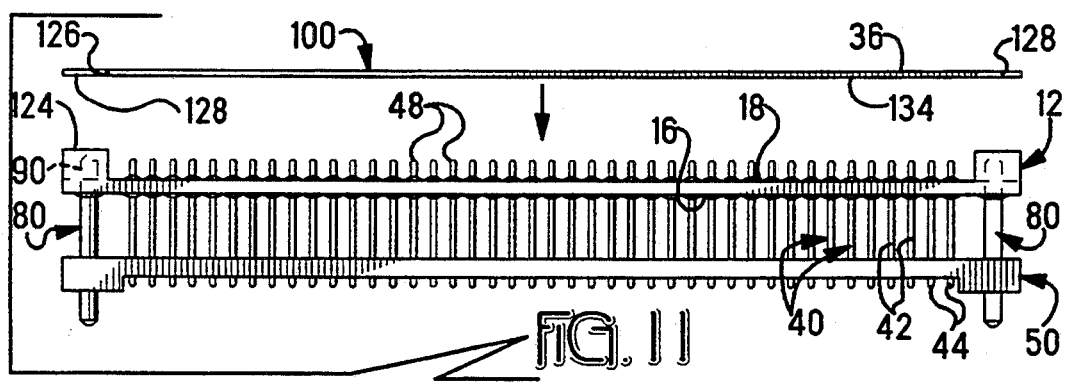
FIG. 11 is an elevation view of the flexible circuit element being assembled to the connector.

Now referring to FIG. 9, a layout of circuit element 100 is shown in its planar shape, having an array of circuit traces 102 extending to opposed second interconnection regions 110 from first interconnection region 104. Each circuit trace 102 extends from a terminus 120 which has a pin-receiving aperture 122 therethrough for receipt of an end of contact section 48 of an associated contact 40 upon assembly into connector 10. A layer of copper has been adhered to the housing-proximate surface 134 of element 100 (see FIG. 11) and then coated with a dielectric layer, with traces 102 being disposed on the housing-remote surface 136 over which is placed an outer layer of dielectric film as is conventional. The layer has been etched to define an edge 18 (shown in phantom) spaced from each second interconnection region 110 for electrical isolation, and similarly has been etched around each pin-receiving aperture 122 at annular edges 124, shown in phantom.

Extending from lateral edges 126 of element 100 at the centers thereof are tabs 128. Apertures 130,132 of tabs 128 are associated with guide posts 80 and are precisely located with respect to pin-receiving apertures 122. Guide post aperture 130 is circular and is used as the primary datum for precision film alignment during assembly, while guide post aperture 132 is oblong along an axis intersecting apertures 130, permitting forgiveness of tolerance in the direction along the axis while maintaining precision film alignment transversely of that axis and serving as a secondary datum. Upon assembly of circuit element 100 to second face 18 of housing 12 and receipt of second sections 86 of guide posts 80 through apertures 130,132, the array of pin-receiving apertures 122 are precisely aligned with contact sections 48 of contacts 40.

Flexible circuit element 100 may be made for example and using conventional methods, by: providing a first layer of film (which will define the housing-remote surface 136); roll cladding thereonto a first thin sheet of copper; applying a mask to all desired trace circuits of the pattern and chemically etching away all unmasked copper; applying a second layer of adhesive-backed film along the housing-proximate surface 134; preferably applying a second thin copper layer to the housing-proximate surface, and etching that copper from second interconnecting regions 110 and from annular regions overlying the film-covered trace termini 120, and also providing a dielectric coating over the second metal layer such as an additional laminate of adhesive-backed film; removing all film from second interconnecting regions 110 such as by chemical solvent or by laser ablation; removing the portions of film disposed over the trace termini 120, by laser ablation; and drilling or punching the pin-receiving holes 122 through the trace termini and underlying film layer. The film layers may be for example adhesive-backed KAPTON polyimide film sold by E. I. du Pont de Nemours & Co., Wilmington, Del. Windows are defined at second interconnecting regions 110, with portions of the insulative film and metal layer being retained at ends of the interconnecting region and along free edge 108 providing structural strength at free ends 108 thus protecting the exposed circuit trace portions 116 from damage or position disturbance during handling.

Figure 10:
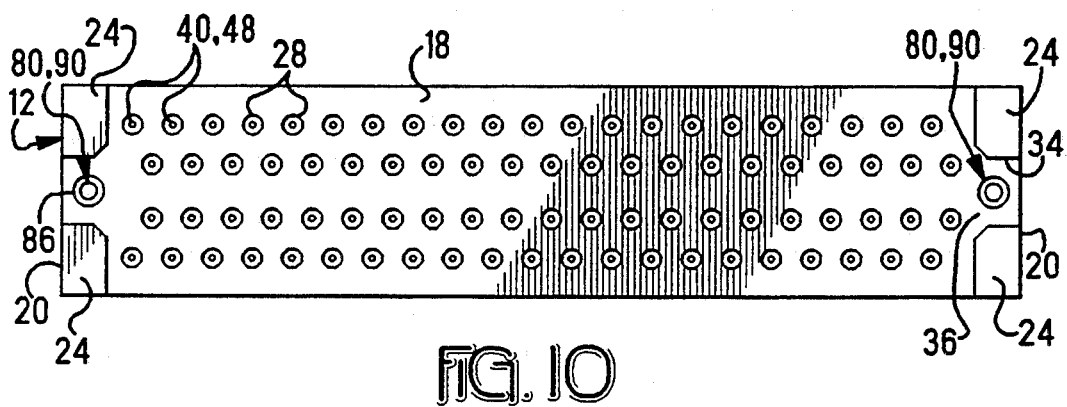
FIG. 10 is a plan view of the housing prior to assembly thereto of the flexible circuit element of FIG. 9.

In FIG. 10, the second face 18 is seen in a plan view, with contact sections 48 of contacts 40 seen with frustoconical embossments 28 therearound. Ends 90 of second sections 86 of guide posts 80 are seen at each flange 20 of housing 12 situated between the pairs of embossments 24 and have frustoconical embossments 32 therearound. Opposing surfaces 34 of embossments 24 of each pair are spaced apart defining a tab-receiving recess 36 facilitating alignment of circuit element 100 during connector assembly prior to soldering of contact sections 48 to termini 120 and securing circuit element 100 to housing 12.

Circuit element 100 is assembled into connector 10 as represented in FIGS. 11 to 14, with FIGS. 12 to 14 being end views. Circuit element 100 is positioned above second face 18 of housing 12 with tabs 128 above ends 90 of guide posts 80 and first interconnection region 104 being disposed above contact sections 48 of contacts 40, and with pin-receiving apertures 122 being aligned with respective ones of contact sections 48. Circuit element 100 is then placed onto second face 18 with guide post ends 90 being received through apertures 130,132 and subsequently contact sections 48 being received through pin-receiving apertures 122. Pin contact sections 48 are then soldered to circuit trace termini 120 exposed along housing-remote surface 136, and portions 106 are then formed upwardly from housing 12 just outwardly of the sides thereof, and then inwardly, for opposed second interconnection regions to oppose each other to define a card-receiving region therebetween.

Potting material 22 such as epoxy resin is then applied and cured along housing-remote surface 136 of circuit element 100 to insulate, seal and protect first interconnection region 104 and the solder connections between circuit traces 102 and contacts 40. The potting material is also deposited between the pairs of embossments 24 embedding tabs 128 and ends 90 of guide posts 80, and the material is deposited such as up a depth equal to the height of embossments 24. Upon curing, potting material 22 adheres to the exposed adjacent surfaces of embossments 24 and to the upper ends of contact sections 48 and ends 90 of guide posts, potting material having a thickness of between 0.070 inches and 0.080 inches, all providing a securing mechanism for circuit element 100 to be assuredly affixed to the connector, providing enhanced structural rigidity to the connector and sealing and defining strain relief to the solder joints for assuring optimal long-term electrical performance.

FIGS. 15 and 16 illustrate an alternate embodiment of connector 400 again having a housing 402, alignment member 404, pair of guide posts 406, array of contacts 408, circuit element 410. Connector 400 has fewer contacts 408 than the embodiments of FIGS. 1 to 14, and therefore circuit element 410 needs to define only one second interconnection region to be interconnected with traces on only one surface of a daughter card (not shown).

Variations and modifications may be made to the embodiments disclosed herein which are within the spirit of the invention and the scope of the claims.

What is claimed is:

1. An electrical connector assembly for being mounted to a circuit board for pin sections of contacts thereof to be interconnected to circuits of the circuit board, comprising:
  a dielectric housing having an array of contact members affixed thereto, each of said contact members including an elongate pin section extending orthogonally from a board-proximate face of said housing to a leading end for receipt into a through-hole of said circuit board upon board mounting for interconnection to a corresponding circuit thereof, and further including an interconnection section at least exposed along a board-remote face of said housing for electrical interconnection with a corresponding conductor;
  an alignment plate of dielectric material initially disposed adjacent said leading ends of said elongate pin sections, said alignment plate including an array of pin-receiving apertures therethrough from a housing-proximate surface to a board-proximate surface thereof, each said pin-receiving aperture having a diameter just slightly larger than the diameter of a corresponding said pin section; and
  a guide post at each end of said housing extending orthogonally from said board-proximate face thereof to a leading end and having a length greater than the length of said elongate pin sections;
  said alignment plate including at each end a post-receiving aperture in which a first section of a respective said guide post is disposed with a leading portion of said guide post extending at least initially beyond said board-proximate surface of said alignment plate to a leading end, and each said guide post including a second section which is disposed within a corresponding post-receiving aperture of said housing through a corresponding said end thereof, and said guide post being at least immovably affixed to one of said housing and said alignment plate with a corresponding said post-receiving aperture of the other of said housing and said alignment plate having a diameter just slightly greater than the diameter of said guide post, all defining a connector assembly,
  whereby upon mounting to said circuit board, leading ends of said guide posts are received into corresponding holes of said circuit board at ends of the array of through-holes assuring precise positioning of said connector assembly with respect to said array of through-holes and alignment of said pin sections with said through-holes prior to receipt of said leading ends of said pin sections into corresponding said through-holes, and as said connector assembly is pressed onto said mounting surface of said circuit board and said board-proximate surface of said alignment plate engages and abuts said circuit board, said housing is moved toward and against said housing-proximate surface of said alignment plate with one of said housing and said alignment plate moving relatively along said guide posts.

2. An electrical connector assembly as set forth in claim 1, wherein said alignment plate includes embossments at each end extending from said board-proximate surface thereof having a selected small height and adapted to engage said mounting surface of said circuit board to provide a spacing equal to said selected small height between said board-proximate surface and said mounting surface, facilitating cleaning of solder flux from therebetween during soldering of said pin sections and said circuits of said circuit board after connector mounting.

3. An electrical connector assembly as set forth in claim 1, wherein said housing-proximate surface of said alignment plate and said board-proximate face of said housing are substantially planar and adapted to abut each other upon full board mounting of said connector assembly.

4. An electrical connector assembly as set forth in claim 3, wherein said housing includes frustoconical embossments extending from said board-proximate surface around each said pin section extending therefrom, and said alignment plate includes complementary frustoconical recesses extending into said housing-proximate surface thereof around each said pin-receiving aperture, enabling flush abutment of said board-proximate face and said housing-proximate surface.

5. An electrical connector assembly as set forth in claim 3, wherein said housing includes frustoconical embossments extending from said board-proximate surface around each said guide post extending therefrom, and said alignment plate includes complementary frustoconical recesses extending into said housing-proximate surface thereof around each said post-receiving aperture, enabling flush abutment of said board-proximate face and said housing-proximate surface.

6. An electrical connector as set forth in claim 1, wherein said guide posts are at least assuredly affixed to said alignment plate, with said first sections thereof immovably retained within said post-receiving apertures of said alignment plate, and said post-receiving apertures of said housing are just slightly larger than said second sections of said guide posts extending therethrough and movable therealong during connector mounting to said circuit board.

7. An electrical connector as set forth in claim 6, wherein said second section of each said guide post include an annular groove therearound, and said post-receiving apertures of said alignment plate each include a corresponding annular ridge along the interior surface thereof elastically deformable radially outwardly during guide post insertion and adapted to become seated in said annular groove upon completion of said guide post insertion.

8. An electrical connector assembly as set forth in claim 1, wherein said guide posts are at least assuredly affixed to said housing, with said second sections thereof immovably retained within said post-receiving apertures of said housing, and said post-receiving apertures of said alignment plate are just slightly larger than said first sections of said guide posts extending therethrough and movable therealong during connector mounting to said circuit board.

9. An electrical connector assembly as set forth in claim 8, wherein said guide posts are forced into said post-receiving apertures of said housing and retained therein by the resulting interference fit.

10. An electrical connector as set forth in claim 9, wherein said second section of each said guide post include an annular groove therearound, and said post-receiving apertures of said housing each include a corresponding annular ridge along the interior surface thereof elastically deformable radially outwardly during guide post insertion and adapted to become seated in said annular groove upon completion of said guide post insertion.

* * * * *